(12) United States Patent
Wang

(10) Patent No.: US 7,191,200 B2
(45) Date of Patent: Mar. 13, 2007

(54) METHOD AND APPARATUS FOR BINARY NUMBER CONVERSION

(75) Inventor: Peng-Hua Wang, Chang Hua (TW)

(73) Assignee: Silicon Integrated Systems Corporation, Hsinchu (TW)

( * ) Notice: Subject to any disclaimer, the term of this patent is extended or adjusted under 35 U.S.C. 154(b) by 663 days.

(21) Appl. No.: 10/616,646

(22) Filed: Jul. 10, 2003

(65) Prior Publication Data

US 2005/0010622 A1    Jan. 13, 2005

(51) Int. Cl.
*G06F 7/00*    (2006.01)
(52) U.S. Cl. ......................... 708/204; 341/95
(58) Field of Classification Search ............... 708/204; 341/95
See application file for complete search history.

(56) References Cited

U.S. PATENT DOCUMENTS

| | | | | |
|---|---|---|---|---|
| 4,379,286 A | * | 4/1983 | Yokota et al. | 341/81 |
| 4,593,267 A | * | 6/1986 | Kuroda et al. | 341/67 |
| 5,283,577 A | * | 2/1994 | Coenen | 341/95 |

* cited by examiner

*Primary Examiner*—Tan V. Mai
(74) *Attorney, Agent, or Firm*—Thomas, Kayden, Horstemeyer & Risley

(57) ABSTRACT

The method and apparatus use two inequalities to determine whether an estimated value obtained from conventional method and a correct value obtained from ideal conversion is identical. When those values are the same, the estimated value is not corrected; otherwise, according to the difference between those values, one is added or subtracted from the estimated value to obtain the correct result.

5 Claims, 4 Drawing Sheets

METHOD AND APPARATUS FOR BINARY NUMBER CONVERSION

BACKGROUND OF THE INVENTION

1. Field of the Invention

The present invention relates to digital data processing. More particularly, the present invention relates to a method and an apparatus for binary number conversion.

2. Description of the Related Art

Conversions between fixed-point binary numbers occur frequently in digital systems. When processing bits of two electronic devices in the same system are different, for example, a signal input into a video card is 5 bits but internal operation of the video card is 8 bits, the data processing between the input and internal operation needs bits conversion. These data in the video card usually represents colors, brightness, and coordinates. If some mistakes occur during bits conversion, it severely obstructs the normal operation of the video card.

The foregoing bits conversion of a binary number converts an m-bit binary number to an n-bit binary number. An unsigned m-bit binary number is able to represent an integer from 0 to $2^m-1$. An ideal conversion from an m-bit binary number to its n-bit counter part is to map 0 (the smallest value represented by m bits) to 0 (the smallest value represented by n bits), and to map $2^m-1$ (the largest value represented by m bits) to $2^n-1$ (the largest value represented by n bits). Besides, other values of the m-bit binary number also respectively and individually correspond to other values of the n-bit binary number, and it is a one-to-one ideal corresponding relation.

This one-to-one ideal corresponding relation is expressed by the equation $$y = f(x) = \left[ x \cdot \frac{2^n - 1}{2^m - 1} + 0.5 \right] \quad (1)$$

where x is a value of an m-bit binary number, and y is a correct value of an n-bit binary number converted from m-bit binary number. The addition of 0.5 thereto means "round to nearest". The symbol [I] represents the floor equation or Gauss equation whose value is the largest integer less than I. For example, a value of [3.4] is 3, and a value of [4.6] is 4. Combination of [I] and +0.5 therein can therefore accomplish rounding operation; i.e. a value of [3.4+0.5] is still 3, but a value of [4.6+0.5] becomes 5. From the foregoing description, the equation (1) linearly maps x=0 (the smallest value represented by m bits) to y=0 (the smallest value represented by n bits), and x=$2^m-1$ (the largest value represented by m bits) to y=$2^n-1$ (the largest value represented by n bits). Moreover, other values of x also respectively and individually map to other corresponding correct values of y.

However, modern digital systems do not use this ideal conversion method to convert a binary number between different bits, but rather use a method as illustrated in the following with reference to FIG. 1A to quickly convert a binary number between different bits without correctly rounding.

FIG. 1A is a schematic view of a conventional conversion method of a binary number between different bits. As illustrated in FIG. 1A, when an m-bit binary number 102 is converted to an n-bit binary number 104, the conversion method first supposes $$n = mq + r, \quad (2)$$

where $0 \leq r < m$, and m·n·q·r are positive integers.

Then the binary number 102 is duplicated q times to obtain an m*q bits binary number. The m*q bits binary number is regarded as a most significant bits number 108 of the binary number 104. Further, the most significant r bits of the binary number 102 are copied to be a least significant bits number 106 of the binary number 104. The conventional method thus duplicates and combines the binary number as foregoing to obtain quickly the converted n-bit binary number 104 without a real numerical operation.

In FIG. 1A, a value of the binary number 102 is x, and a value of the binary number 104 converted thereby is y', the y' is an estimated value converted from the binary number 102, and is different from the correct value y. The conventional method obtains the binary number 104 without the real numerical operation, and the estimated value y' can be represented by equation.

$$y' = x \left( \sum_{i=1}^{q} 2^{r+m(q-1)} \right) + \left[ \frac{x}{2^{m-r}} \right] \quad (3)$$

However, the value y' obtained from equation (3) of the conventional conversion method is an estimated value, and may not be equal to the value y obtained from equation (1) of ideal conversion method. The values y and y' of some values x respectively obtained from these two method are different. The following description cites an instance to interpret this inaccuracy, and uses a table to explain it in detail.

A 5-bit binary number 112 in FIG. 1B is converted to an 8-bit binary number 114 by using the conventional conversion method as illustrated in FIG. 1A. The 5-bit binary number 112 is composed of α, β, γ, δ, and ε, the 5 bits are arranged in order from the most significant bit to the least significant bit.

In FIG. 1B, the m and n are 5 and 8, respectively. The 5-bit binary number 112 needs to be duplicated once to be a most significant bits number 118 of the 8-bit binary number 114 during conversion. And the most significant r=3 bits α, β, and γ of the 5-bit binary number 112 are duplicated as a least significant number 116 of the 8-bit binary number 114. The foregoing conventional conversion method thus can obtain the 8-bit binary number 114, and α, β, γ, δ, ε, α, β, and γ thereof are arranged from the most significant bit to the least significant bit, as illustrated in FIG. 1B.

The description thereinafter describes several actual values x of the 5-bit binary number 112 are converted as several estimated values y' of the 8-bit binary number 114, and compared with the correct values y thereof obtained from the ideal conversion method in Table. 1 to represent concretely errors made by the conventional conversion method. The 5-bit binary number 112 can used to represents 32 numbers from 0 (00000) to 31 (11111). These 32 numbers are respectively converted by ideal and conventional conversion method to obtain 32 8-bits numbers whose minimum value is (00000000) and maximum value is 255 (11111111).

In Table. 1, a value x is a value of the original 5-bit binary number. A correct value y is a value obtained by equation (1) of the ideal conversion method. An estimated value y' is a value obtained by equation (3) of the conventional conversion method. A difference value e is a value of (y–y'), and the difference value e is represented by $$e = y - y' = \left[x\frac{2^3-1}{2^5-1} + 0.5\right] - \left[\frac{x}{2^2}\right] \quad (4)$$

TABLE 1

A comparison between the values of 5-bit binary number and 8-binary number converted thereby.

| x | y | y' | e |
|---|---|---|---|
| 0 | 0 | 0 | 0 |
| 1 | 8 | 8 | 0 |
| 2 | 16 | 16 | 0 |
| 3 | 25 | 24 | 1 |
| 4 | 33 | 33 | 0 |
| 5 | 41 | 41 | 0 |
| 6 | 49 | 49 | 0 |
| 7 | 58 | 57 | 1 |
| 8 | 66 | 66 | 0 |
| 9 | 74 | 74 | 0 |
| 10 | 82 | 82 | 0 |
| 11 | 90 | 90 | 0 |
| 12 | 99 | 99 | 0 |
| 13 | 107 | 107 | 0 |
| 14 | 115 | 115 | 0 |
| 15 | 123 | 123 | 0 |
| 16 | 132 | 132 | 0 |
| 17 | 140 | 140 | 0 |
| 18 | 148 | 148 | 0 |
| 19 | 156 | 156 | 0 |
| 20 | 165 | 165 | 0 |
| 21 | 173 | 173 | 0 |
| 22 | 181 | 181 | 0 |
| 23 | 189 | 189 | 0 |
| 24 | 197 | 198 | −1 |
| 25 | 206 | 206 | 0 |
| 26 | 214 | 214 | 0 |
| 27 | 222 | 222 | 0 |
| 28 | 230 | 231 | −1 |
| 29 | 239 | 239 | 0 |
| 30 | 247 | 247 | 0 |
| 31 | 255 | 255 | 0 |

If the difference value e is equal to zero, the estimated value y' and the correct value y are identical. The estimated value is the correct result, and additional modification is unnecessary. But if the difference value e is not equal to zero, the estimated value y' is different from the correct value y, and some mistakes occur during bits conversion of a binary number between different bits.

As illustrated in Table. 1, when the value of the original 5-bit binary number 112 is 3, 7, 24, or 28, the estimated value y' of the 8-bit binary 114 obtained by conventional conversion method is different from the correct value y obtained by ideal conversion method, respectively. When x is 3 or 7, the estimated value y' is more than the correct value y with one; when x is 24 or 28, the estimated value y' is less than the correct value y with one. The conventional conversion method therefore generates mistakes during conversion of a binary number between different bits when x is 3, 7, 24, or 28.

For digital data processing, a mistake during conversion of a binary number between different bits causes very serious problems. For example, these incorrect estimated values obtained by conventional conversion method generally are input values for a subsequent operation, and after many operations, the inaccuracy between the results of operating with incorrect estimated values and correct values becomes very large.

In an example of a video card, digital data usually represents colors, brightness, and/or coordinates. If mistakes occur during bits conversion, deviations of colors and coordinates may be caused. The deviation of colors makes colors of an image outputted from the video card incorrect, and the deviation of coordinates makes a graph plotted referring to these coordinates incorrect. Furthermore, the video card uses the converted values to query a table, or uses the converted values to be a reference coordinates to query colors. These queries generate mistakes due to these incorrect estimated values, and thus severely obstruct the normal operation of the video card.

SUMMARY OF THE INVENTION

It is therefore an objective of the present invention to provide a method and an apparatus for binary number conversion that satisfies the need to solve the problem of conversion of a binary number between different bits.

In accordance with the foregoing and other objectives of the present invention, a method and an apparatus are described. The method and apparatus of the invention use two inequalities to determine whether an estimated value obtained from conventional method and a correct value obtained from ideal conversion is identical. When those values are the same, the estimated value is not corrected; otherwise, according to the difference between those values, one is added or subtracted from the estimated value to obtain the correct result.

In one preferred embodiment of the present invention, an m-bit first binary number in a digital data processing system is converted to an n-bit second binary number, wherein n=m*q+r, $0 \leq r < m \cdot n \cdot q \cdot r$ are positive integers.

The first binary number is duplicated from the most significant bit to the least significant bit thereof to form a n-bit third binary number, in which r bits of the first binary number duplicated at the last time are defined as a first number, and remaining bits of the first binary number without the first number are defined as a second number.

Then the first number and the second number are swapped to form a fourth binary number. A value of the second binary number is subtracted from a value of the fourth binary number to obtain a difference value. When the difference value is larger than or equal to $0.5*(2^m-1)$, one is added to the first number of the third binary number to obtain the second binary number; when the difference value is less than $-0.5*(2^m-1)$, one is subtracted from the first number of the third binary number to obtain the second binary number; when the difference value is not larger than or not equal to $0.5*(2^m-1)$, and not less than $-0.5*(2^m-1)$, the third binary number is equal to the second binary number.

In another preferred embodiment of the present invention, an original binary number, an original bit quantity m, and a converted bit quantity n are input into a determination unit, and the determination unit calculates q and r by n=m*q+r, and $0 \leq r < m$.

The determination unit sends the original binary number to a bits replicator. The bits replicator duplicates the original binary number q times, and obtains a binary number composed of m*q bits. Moreover, the determination unit sends the original binary number to a mask. The mask masks the unnecessary bits of the original binary number according to r and then obtains a binary number composed of r bits.

A bits swapper swaps the r-bit most significant bits number and the (m−r) bits least significant bits number to form a swapped binary number. Positive and negative signs are respectively attached to the swapped binary number and the original binary number, and then they added together by an adder. A result obtained from adder is sent to the 2-level comparator. An incrementor/decrementor modifies the r-bit binary number received from the mask according to the comparison result.

Subsequently, an r-bit binary number modified in the incrementor/decrementor is sent to a combination unit to be the least significant bits of the result binary number. At the same time, the m*q-bit binary number obtained from the bits replicator is also sent to the combination unit to be the most significant bits of the result binary number. The combination unit therefore combines the two binary numbers provided by the bits replicator and the incrementor/decrementor, and outputs a correct converted binary number from an output port.

In another preferred embodiment of the present invention, a method and an apparatus of the invention is utilized in a video card. The foregoing second binary number is represented colors or coordinates.

In conclusion, the invention modifies an incorrect result obtained from the conventional conversion method by a simple method to obtain the correct result, without complicated rounding. The invention also uses a difference value between the original binary number and the swapped binary number thereby to compare with a predetermined value. According to the difference value, the simple 2-level comparison method of the invention therefore modifies the estimated value from the convention conversion, finally obtaining the correct result.

In another aspect, the invention can be implemented with only the bits duplication and combination of binary numbers, and a simple numerical comparison step. In digital data processing systems, such as video cards, the processing speed is faster following the great progress of the science and technology. Methods and apparatuses able to quickly and correctly accomplish conversion between different bits are therefore needed. The method of the invention no only avoids the deviations of colors and coordinates in the conventional video card, but also does not slow the processing speed of the video card, so as to make the video card operate normally.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENT

Figure 1A:
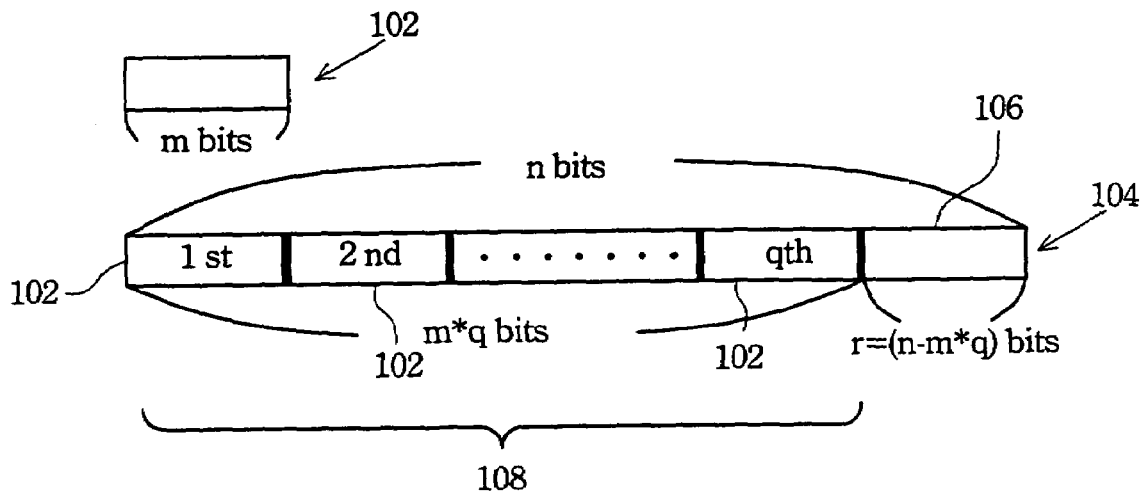
FIG. 1A is a schematic view of a conventional conversion method of a binary number between different bits.
Figure 1B:
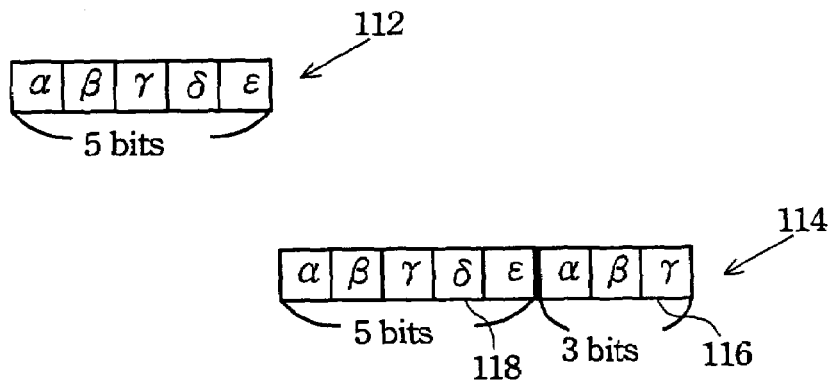
FIG. 1B is a schematic view of a 5-bit binary number converted to an 8-bit binary number by using the conventional conversion method in FIG. 1A.

Reference will now be made in detail to the present preferred embodiments of the invention, examples of which are illustrated in the accompanying drawings. Wherever possible, the same reference numbers are used in the drawings and the description to refer to the same or like parts.

The present invention provides a method and an apparatus for binary number conversion to solve the problem of conversion of a binary number between different bits.

The method and apparatus of the invention use two inequalities to determine whether an estimated value obtained from conventional method and a correct value obtained from ideal conversion is identical. When those values are the same, the estimated value is not corrected; otherwise, according to the difference between those values, one is added or subtracted from the estimated value to obtain the correct result.

The following descriptions explain the invention by the m-bit binary number 102 and the n-bit binary number 104 converted thereby in FIG. 1A. For simple and clear explanation, the q of the equation (2) is set to 1 to make a bit quantity relation between the two binary numbers become n=m+r. However, if the bit quantity relation between the two binary numbers is q being an integer more than one, the invention also can convert a binary number to obtain the correct result.

A binary number 202 is composed of m bits, and a value thereof is x. Therefore, a correct value of a binary number thereof converted by the equation (1) of the ideal conversion method is $$y = f(x) = \left[x \cdot \frac{2^n - 1}{2^m - 1} + 0.5\right] \quad (1')$$

The binary number 202 also can be converted to a binary number by the equation (3) of the conventional conversion method, and the estimated value thereof is $$y' = 2^r x + \left[\frac{x}{2^{m-r}}\right] \quad (5)$$

A difference value between the correct value y and the estimated value y' obtained from the two conversion method is $$e = y - y' = \left[x \frac{2^r - 1}{2^m - 1} + 0.5\right] - \left[\frac{x}{2^{m-r}}\right] \quad (6)$$

Figure 2:
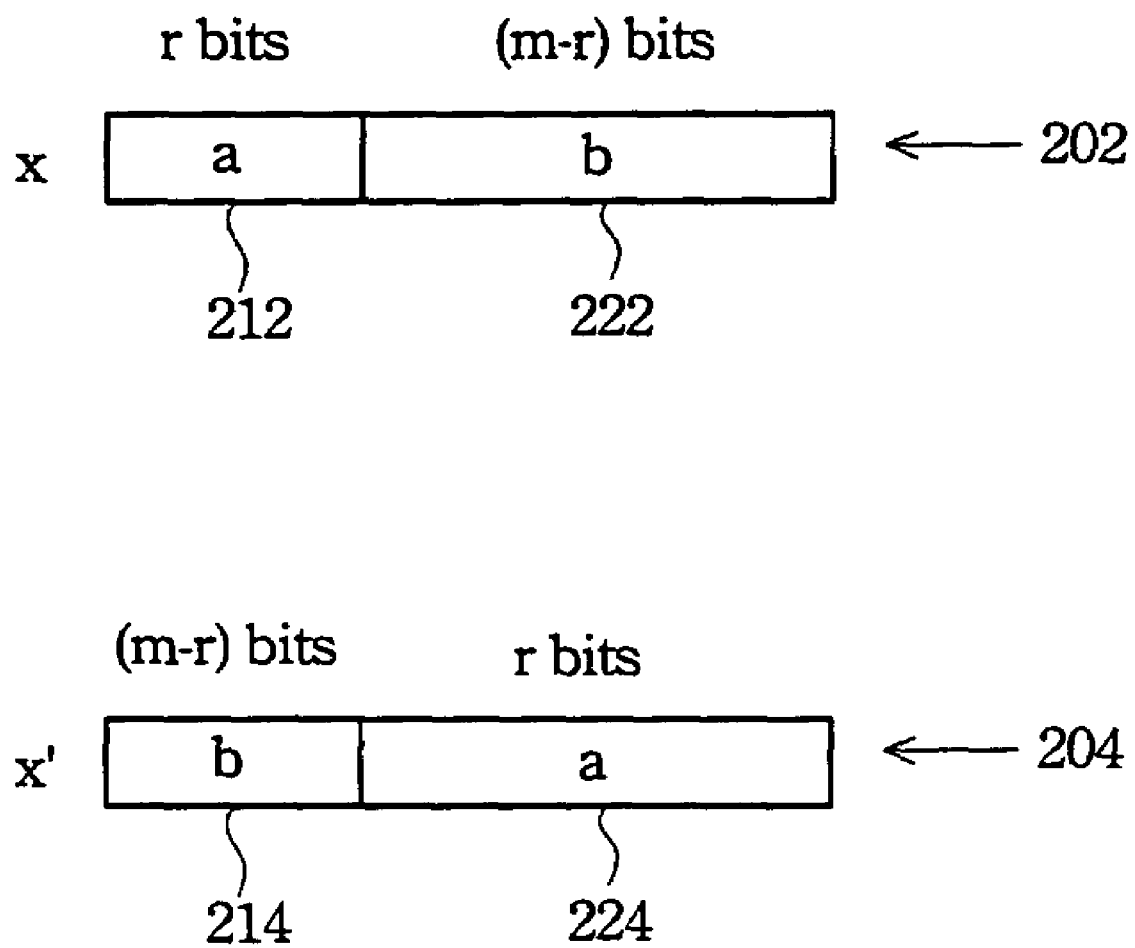
FIG. 2 is a schematic view of x and x' in accordance with one embodiment of the invention.

Divide the binary number 202 into two portions as a most significant bits number 212 and a least significant bits number 222 illustrated as FIG. 2. The most significant bits number 212 is composed of r bits, and a value thereof is a; the least significant bits number 222 is composed of (m−r) bits, and a value thereof is b. The value x of the binary number 202 can be represented by a and b as $$x = 2^{m-r}a + b, \text{ where } 0 \leq a < 2^r, \text{ and } 0 \leq b < 2^{m-r} \quad (7)$$

Equation (7) is substituted into x of equation (6) to simplify equasion (6) as $$e = \left[ \frac{a(-2^{m-r}+1) + b(2^r - 1)}{2^m - 1} + 0.5 \right] \quad (8)$$

If the difference value e between the correct value y and the estimated value y' is not equal to 0, the difference value e must be more than 0 or less than 0, and the absolute value of the difference value e is the integer 1. For easily simplification, the invention selects two conditions: $e \geq 1$ and $e<0$ to represent some conditions of e being not equal to 0, so as to make right sides of two inequalities in these two conditions only different from positive and negative signs thereof. Thus the following two inequalities are obtained $$a \cdot (-2^{m-r}+1) + b \cdot (2^r - 1) \geq 0.5 \cdot (2^m - 1) \quad (9)$$

$$a \cdot (-2^{m-r}+1) + b \cdot (2^r - 1) < -0.5 \cdot (2^m - 1) \quad (10)$$

The most significant bits number 212 and the least significant bits number 222 of the binary number 202 are swapped to form a new binary number 204. A value of the binary number 204 is x', the most significant bits number 214 thereof is composed of (m−r) bits, and a value thereof is b; the least significant bits number 224 thereof is composed of r bits, and a value thereof is a. The value x~ of the binary number 204 can be represented as $$x' = 2^r b + a \quad (11)$$

Then equation (7) and equation (11) are substituted into x and x' of inequalities (6) and (7) to obtain two simplified inequalities $$x' - x \geq 0.5 \cdot (2^m - 1) \quad (12)$$

$$x' - x < -0.5 \cdot (2^m - 1) \quad (13)$$

The invention uses the two inequalities to determine whether an original binary number generates an incorrect result after the conventional conversion. First, a value x of the original binary number and a value x' of the most and least significant bits number swapped thereof are substituted into the inequalities (12) and (13). When the inequality (12) is true, e=1, and the estimated value y' is one less than the correct value y, so one is added to the estimated value y' to obtain the correct result. In another aspect, when the inequality (13) is true:, e=1, and the estimated value y' is one more than the correct value y, so one is subtracted from the estimated value y' to obtain the correct result. If the equalities (12) and (13) both are not true, e=0, the estimated value is equal to the correct value y, and no further modification is needed. The invention utilizes the conventional conversion to convert quickly a binary number between different bits and cooperates inequalities to modify the converted binary number, thus quickly and correctly obtains the converted result.

Figure 3:
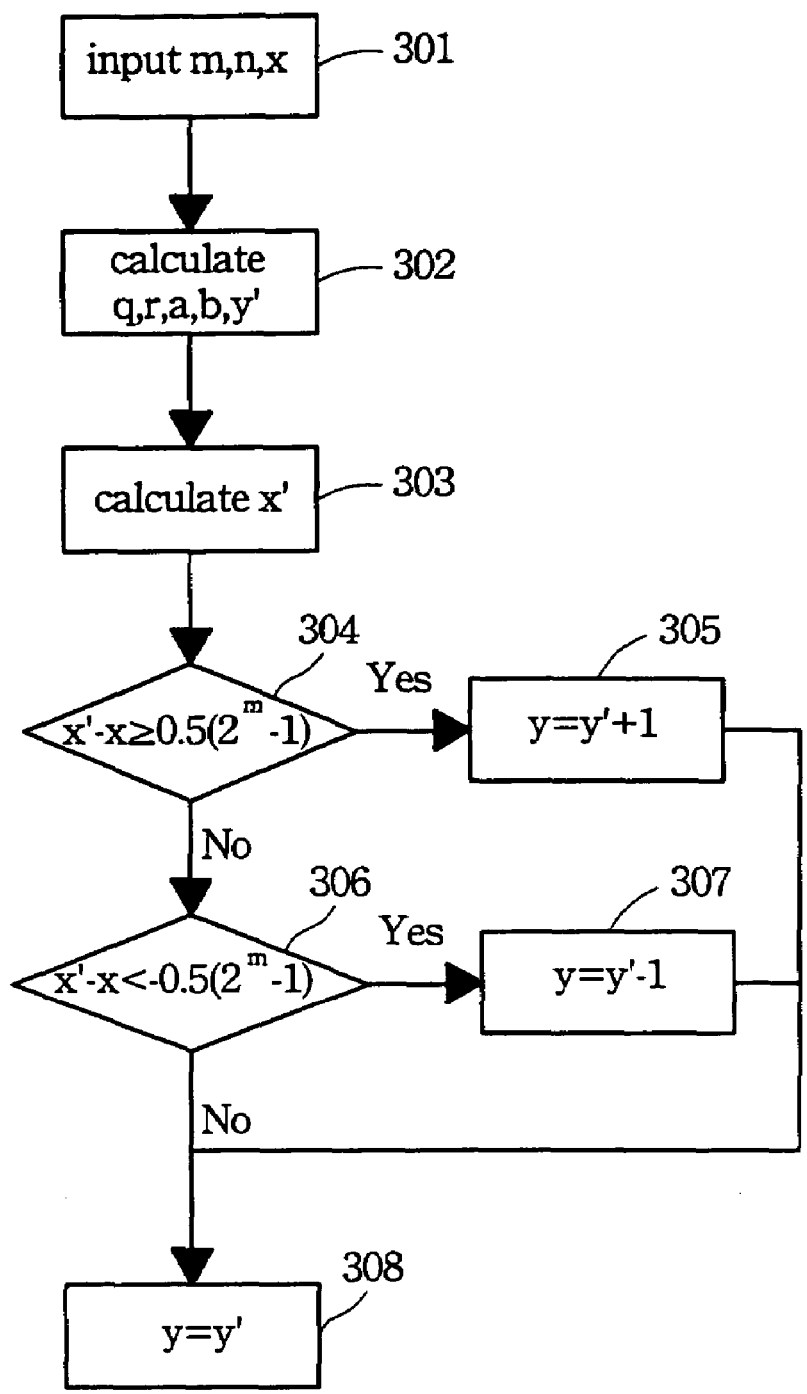
FIG. 3 is a flow chart of the method of the invention.

FIG. 3 is a flow chart of one embodiment of the invention. The symbols m, n, x, q, r, a, b, and y' are the same as in the foregoing description. The m, n, and x are input at the beginning in a step 301. The equation (2), equation (3) and equation (7) are then used to calculate the q, r, a, b, and y, respectively, in step 302. The a, b, and r obtained in step 302 are brought into the equation (11) to calculate the x' in a step 303.

Afterward, x and x' are compared by the 2-level steps 304–307. First, x and x' are substituted into the inequality (12) in a step 304. If a result thereof is true, then a step 305 is carried out to add one to the estimated value y' to obtain the correct value y. Otherwise, if the result of the inequality (12) is wrong, then a step 306 is carried out, and x and x' are substituted into the inequality (13). If a result of the inequality (13) is true, then a step 307 is carried out to subtract one from the estimated value y' to obtain the correct value y. If the result of the inequality (13) is still wrong, then a step 308 is carried out; at this time the estimated value y' is equal to the correct value y, and no further modification is needed.

Figure 4:
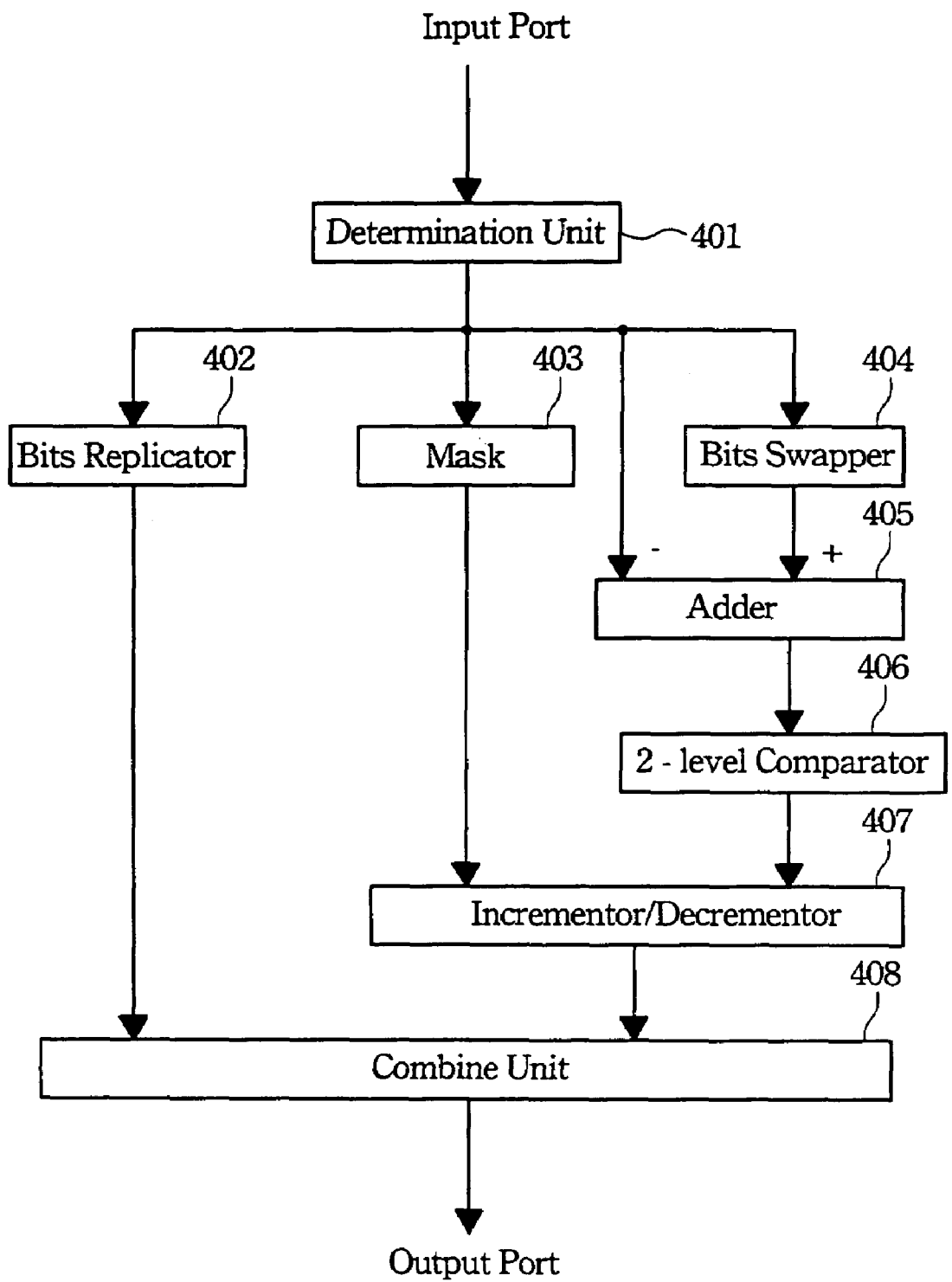
FIG. 4 is a schematic view in accordance with one embodiment of the invention.

FIG. 4 is a schematic view of another preferred embodiment of the invention, and the following descriptions also refer to the flow chart in FIG. 3 to explain the preferred embodiment. Step 301 in FIG. 3 is first carried out to input an original binary number, an original bit quantity m and a converted bit quantity n into a determination unit 401 from an input port. Then the determination unit 401 is in charge of processing the step 302 to calculate q and r.

The determination unit 401 sends the original binary number to a bits replicator 402. The bits replicator 402 duplicates the original binary number by q times, and obtains a binary number composed of m*q bits. Moreover, the determination unit 401 further sends the original binary number to a mask 403. The mask 403 masks the unnecessary bits of the original binary number according to the r and then obtains a binary number composed of r bits.

A bits swapper 404 swaps the r-bit most significant bits number and the (m−r) bits least significant bits number to form a swapped binary number. Positive and negative signs are respectively attached to the swapped binary number and the original binary number, and then they are added together by an adder 405. A result obtained from adder 405 is sent into 2-level comparator 406, and the steps 304 and 306 in FIG. 3 are carried out. An incrementor/decrementor 407 modify the r-bit binary number received from the mask 403 according to the comparison result of the steps 304 and 306 in FIG. 3.

Subsequently, an r-bit binary number modified in the incrementor/decrementor 407 is sent to a combination unit 408 to be the least significant bits of the result binary number. At the same time, the m*q-bit binary number obtained from the bits replicator 402 is also sent to the combination unit 408 to be the most significant bits of the result binary number. The combination unit 408 therefore combines the two binary numbers provided by the bits replicator 402 and the incrementor/decrementor 407, and outputs a correct converted binary number from an output port.

In conclusion, the invention modifies an incorrect result obtained from the conventional conversion method by a simple method to obtain the correct result, without complicated rounding. The invention also uses a difference value between the original binary number and the swapped binary number thereby to compare with a predetermined value. According to the difference value, the simple 2-level comparison method of the invention therefore modifies the estimated value from the convention conversion, and finally obtains the correct result.

In another aspect, the invention can be implemented with only the bits duplication and combination of binary numbers, and a simple numerical comparison step. Digital data processing systems, such as video cards, the processing speed is faster following the great progress of the science and technology. Methods and apparatuses able to accomplish quickly and correctly conversion between different bits are therefore needed. Binary numbers in the invention usually represents colors or coordinates in the video card.

The method of the invention no only avoids the deviations of colors and coordinates in the conventional video card, but also does not slow the processing speed of the video card, so as to make the video card operate normally.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. An apparatus for binary number conversion, provided in a digital data processing system to convert an in-bit first binary number to a n-bit second binary number, wherein $n=m*q=r$, $0 \leq r < m$, and m·n·q·r are positive integers, the apparatus for binary number conversion comprising:
    a determination unit, input the first binary number, m, and n from an input port, and calculating q and r;
    a bits replicator, receiving the first binary number, and q from the determination unit, and duplicating the first binary number q times to obtain a first number;
    a mask, receiving the first binary number, m and r from the determination unit, and masking the least significant (m−r) bits of the first binary number to obtain a second number;
    a bits swapper, receiving the first binary number from the determination unit, and swapping the second number of the first binary number and a third number formed by the significant (m−r) bits of the first binary number to obtain a third binary number;
    an adder, receiving the third binary number from the bits swapper, and receiving the first binary number from the determination unit, then subtracting a value of the first binary number from a value of the third binary number to obtain a difference value;
    a 2-level comparator, receiving the difference value from the adder, and generating a modification instruction based on a rule referring the difference value;
    an incrementor/decrementor, receiving the second number from the mask, and receiving the modification instruction from the 2-level comparator, then modifying the second number according to the modification instruction to obtain a fourth number; and
    a combine unit, receiving the first number from the bits replicator, and receiving the fourth number from the incrementor/decrementor, then making the first number and the fourth number respectively be most significant bits and least significant bits of the second binary number.

2. The apparatus of claim 1, wherein the digital data processing system is a video card.

3. The apparatus of claim 2, wherein the second binary number is a digital signal for representing colors.

4. The apparatus of claim 2, wherein the second binary number is a digital signal for representing coordinates.

5. The apparatus of claim 1, wherein the rule is:
    when the difference value is larger than or equal to $0.5*(2^m-1)$, generating the modification instruction to order the incrementor/decrementor to add one to the second number to obtain the fourth number;
    when the difference value is less than $-0.5*(2^m-1)$, generating the modification instruction to order the incrementor/decrementor to subtract one from the second number to obtain the fourth number and
    when the difference value is not larger than or not equal to $0.5*(2^m-1)$, and not less than $-0.5*(2^m-1)$, generating the modification instruction to order the incrementor/decrementor not to modify the second number, and the second number is equal to the fourth number.

* * * * *